United States Patent
Nagaraj et al.

(10) Patent No.: US 6,602,356 B1
(45) Date of Patent: Aug. 5, 2003

(54) CVD ALUMINIDING PROCESS FOR PRODUCING A MODIFIED PLATINUM ALUMINIDE BOND COAT FOR IMPROVED HIGH TEMPERATURE PERFORMANCE

(75) Inventors: Bangalore A. Nagaraj, West Chester, OH (US); Jeffrey L. Williams, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/666,959

(22) Filed: Sep. 20, 2000

(51) Int. Cl.[7] .................................................. C23C 8/06
(52) U.S. Cl. ........................ 148/283; 148/290; 427/252; 427/253; 427/255.39
(58) Field of Search ................................. 427/252, 253, 427/255.39; 148/240, 283; 428/469, 472, 632

(56) References Cited

U.S. PATENT DOCUMENTS

| | | | |
|---|---|---|---|
| 4,399,199 A | 8/1983 | McGill et al. | 428/633 |
| 5,261,963 A | 11/1993 | Basta et al. | 118/724 |
| 5,407,704 A | 4/1995 | Basta et al. | 427/248.1 |
| 5,407,705 A | 4/1995 | Vakil | 427/255 |
| 5,658,614 A | 8/1997 | Basta et al. | 427/253 |
| 5,667,663 A | 9/1997 | Rickerby et al. | 205/170 |
| 5,716,720 A | 2/1998 | Murphy | 428/623 |
| 5,788,823 A | 8/1998 | Warnes et al. | 205/192 |
| 5,824,423 A | 10/1998 | Maxwell et al. | 428/623 |
| 5,856,027 A | 1/1999 | Murphy | 428/623 |
| 5,897,966 A | 4/1999 | Grossklaus, Jr. et al. | 428/652 |
| 5,942,337 A | 8/1999 | Rickerby et al. | 428/623 |
| 5,989,733 A | 11/1999 | Warnes et al. | 428/652 |
| 6,022,632 A | 2/2000 | Olson et al. | 428/650 |
| 6,042,880 A | 3/2000 | Rigney et al. | 427/142 |
| 6,045,863 A | 4/2000 | Olson et al. | 427/253 |

*Primary Examiner*—John Sheehan
*Assistant Examiner*—Andrew L Oltmans
(74) *Attorney, Agent, or Firm*—Carmen Santa Maria; McNees Wallace & Nurick, LLC

(57) ABSTRACT

A method of depositing by chemical vapor deposition a modified platinum aluminide diffusion coating onto a superalloy substrate comprising the steps of applying a layer of a platinum group metal to the superalloy substrate; passing an externally generated aluminum halide gas through an internal gas generator which is integral with a retort, the internal gas generator generating a modified halide gas; and co-depositing aluminum and modifier onto the superalloy substrate. In one form, the modified halide gas is hafnium chloride and the modifier is hafnium with the modified platinum aluminum bond coat comprising a single phase additive layer of platinum aluminide with at least about 0.5 percent hafnium by weight percent and about 1 to about 15 weight percent of hafnium in the boundary between a diffusion layer and the additive layer. The bond coat produced by this method is also claimed.

16 Claims, 1 Drawing Sheet

CVD ALUMINIDING PROCESS FOR PRODUCING A MODIFIED PLATINUM ALUMINIDE BOND COAT FOR IMPROVED HIGH TEMPERATURE PERFORMANCE

The invention herein described was made in the performance of work under a NASA contract and is subject to the provisions of Section 305 of the National Aeronautics and Space Act of 1958, Public Law 85-568 (72 Stat. 435; 42 USC 2457).

FIELD OF THE INVENTION

This invention relates generally to components of the hot section of gas turbine engines, and in particular, to a CVD aluminiding process for producing a modified platinum aluminide bond coat for improved high temperature performance.

BACKGROUND OF THE INVENTION

In gas turbine engines, for example, aircraft engines, air is drawn into the front of the engine, compressed by a shaft-mounted rotary compressor, and mixed with fuel. The mixture is burned, and the hot exhaust gases are passed through a turbine mounted on a shaft. The flow of gas turns the turbine, which turns the shaft and drives the compressor. The hot exhaust gases flow from the back of the engine, providing thrust that propels the aircraft forward.

During operation of gas turbine engines, the temperatures of combustion gases may exceed 3,000° F., considerably higher than the melting temperatures of the metal parts of the engine, which are in contact with these gases. The metal parts that are particularly subject to high temperatures, and thus require particular attention with respect to cooling, are the hot section components exposed to the combustion gases, such as blades and vanes used to direct the flow of the hot gases, as well as other components such as shrouds and combustors.

The hotter the exhaust gases, the more efficient is the operation of the jet engine. There is thus an incentive to raise the exhaust gas temperature. However, the maximum temperature of the exhaust gases is normally limited by the materials used to fabricate the hot section components of the turbine. In current engines, hot section components such as the turbine vanes and blades are made of cobalt-based and nickel-based superalloys, and can operate at temperatures of up to 2000°–2300° F.

The metal temperatures can be maintained below melting levels with current cooling techniques by using a combination of improved cooling designs and thermal barrier coatings. In one approach, a thermal barrier coating system is applied to the metallic turbine component, which becomes the substrate. The thermal barrier coating system includes a ceramic thermal barrier coating that is applied to the external surface of metal parts within engines to impede the transfer of heat from hot combustion gases to the metal parts, thus insulating the component from the hot exhaust gas. This permits the exhaust gas to be hotter than would otherwise be possible with the particular material and fabrication process of the component.

Thermal barrier coatings (TBCs) are well-known ceramic coatings, for example, yttrium stabilized zirconia. Ceramic thermal barrier coatings usually do not adhere optimally directly to the superalloys used in the substrates. Therefore, an additional metallic layer called a bond coat is placed for example, by chemical vapor deposition (CVD), between the substrate and the TBC to improve adhesion of the TBC to the underlying component. In one form, the bond coat is made of a diffusion nickel aluminide or platinum aluminide, whose surface oxidizes to form a protective aluminum oxide scale in addition to improving adherence of the ceramic TBC.

The bond coat temperature is critical to the life of the TBC and has been limited to about 2100° F. Once the bond coat exceeds this temperature, the coating system can quickly deteriorate, resulting in separation of the TBC from the bond coat. The addition of small amounts of reactive elements to platinum aluminide coatings, such as Hf, Si, Zr, and Y have been shown to increase performance of such coatings.

U.S. Pat. No. 5,658,614 to Basta et al. discloses a method of improving the oxidation resistance of a platinum modified aluminide coating applied to a nickel based superalloy substrate. In one embodiment, a hafnium-modified aluminide coating was formed using a coating gas mixture of aluminum trichloride, hydrogen and hafnium chloride. The first coating gas mixture was generated externally to a retort holding the platinum-plated workpiece that was to be coated by passing hydrogen and hydrogen chloride over a pure source of aluminum. A second mixture of Ar and HCl was generated in a separate generator external to the retort that also contained a pure hafnium bed, thereby forming hafnium chloride. The mixtures were then introduced concurrently to the coating retort forming a hafnium modified outwardly grown, single phase aluminide coating, as the gases flowed over the workpiece, depositing Hf and Al.

U.S. Pat. No. 5,989,733 to Warnes et al. is directed to a CVD outwardly grown platinum aluminide diffusion coating on a nickel or cobalt based superalloy substrate wherein the platinum modified aluminide diffusion coating is modified to include a combination of hafnium and silicon in a concentration of about 0.01% by weight (w/o) to about 8 w/o of the outer additive layer of the coating. The coating gas mixture was generated externally by passing high purity hydrogen and high purity hydrogen chloride over a high purity pure source of aluminum and then passing the mixture over a high purity pure source of silicon, both sources at 290° C. (554° F.) and external of the retort. A mixture of Ar and HCl was flowed in an external chloride generator through a hafnium bed at 430° C. (806° F.). Both gas coating mixtures were then introduced concurrently to the retort.

Prior modified platinum aluminum bond coat practice, as exemplified by the foregoing U.S. patents, involves generating two or more distinct gas coating mixtures in multiple external gas generators and concurrently introducing these mixtures into the retort.

U.S. Pat. No. 5,667,663 to Rickerby et al. discloses a method for adhering a ceramic TBC layer to a superalloy article containing a predetermined amount of aluminum. After applying a layer of platinum to the superalloy article and heat treating the article, the aluminum diffuses from the superalloy article into the platinum. In one embodiment, hafnium is added to the platinum layer by chemical vapor deposition to up to a level of 0.8 w/o. Deposition of the aluminum by CVD is not disclosed.

What is needed are improved methods to apply these reactive element modified diffusion bond coating systems. The present invention fulfills this need, and further provides related advantages.

SUMMARY OF THE INVENTION

In one form, the present invention provides both an improved method of producing coatings modified with reactive metals, such as hafnium-modified coatings and the coatings produced by that method, utilizing a single gas generation system in a diffusion coating process. An external system generates an aluminum halide gas which, as it is flowed into the system, passes over the reactive metal located between the external generator and the workpiece or parts which are located within a coating retort, and preferably the reactive metal is within, the coating retort where the parts to be coated are located. As used herein, reactive metals include Zr, Hf, V, Nb, Ta, Y, La and Ce. The reactive metal is activated by the aluminum halide gas to form a mixture of aluminum halide gases and at least one reactive metal halide gas species. In this manner, a reactive metal and aluminum are co-deposited by an internal gas generation method onto the parts to be coated as the gases pass over the parts to produce a modified single phase additive layer of platinum aluminide.

In another form, the present invention comprises a chemical vapor deposited outwardly grown platinum aluminide diffusion coating on a nickel or cobalt based superalloy substrate wherein hafnium and aluminum are co-deposited by an internal gas generation method onto the platinum-plated parts to produce a single phase additive layer of platinum aluminide with up to about 0.5 percent hafnium by weight percent, and about 1 to about 15 weight percent of hafnium in the boundary between the diffusion layer and the additive layer.

In yet another embodiment, the present invention comprises a TBC system for application to a superalloy substrate used in the hot section of a gas turbine engine. A layer of a platinum group metal is first applied to the superalloy substrate. A modified platinum aluminide diffusion coating is formed by applying, by co-deposition, aluminum and at least one reactive metal, such as hafnium, using chemical vapor deposition to the platinum group metal, the coating comprising a single phase additive layer of platinum aluminide with at least about 0.1 percent hafnium by weight (w/o) and about 0.1 to about 15 weight percent (w/o) of hafnium in the boundary formed by the diffusion layer between the substrate and the additive layer; and a ceramic thermal barrier coating applied to the modified platinum aluminide diffusion coating. The amount in weight percentage of reactive metal will vary depending upon the species selected.

While in the prior art, hafnium chloride and aluminum chloride gas coating mixtures are separately generated externally then concurrently introduced into the retort causing the hafnium and aluminum to precipitate out as they pass over the workpiece, in the present invention, there is only one external gas generator generating the gases bearing both the reactive metal species and the aluminum. In the additive layer, there is a relatively low concentration of the reactive metal so that the reactive metal is in solution with the platinum and aluminum.

One advantage of the present invention is that the coating system produced by this invention demonstrates increased service life resulting from improved spallation resistance of the TBC system.

Another advantage of the present invention is that the process consists of a single step that additionally coats the internal and external surfaces of an article to be coated with the modified platinum aluminum coating. This one step process allows for cost savings during the manufacturing process.

Still another advantage of the present invention is that the internal gas generation process provides the capability for the modification of existing CVD reactors to produce reactive element-modified coatings without the addition of new external gas generation systems.

Yet another advantage of the present invention is that the process can be easily adapted for use in airfoil material repair operations. It is advantageous to have the ability to repair a damaged section of an airfoil, rather than having to strip the entire TBC coating and completely re-bond and re-coat a TBC coating to the entire part.

Another advantage of the present invention is that the CVD coating device and process can be simplified as the device of the present invention requires only one external gas generator.

Continuing and often interrelated improvements in processes and materials, such as the improvements of the present invention, can provide cost reductions and major increases in the performance of devices such as aircraft gas turbine engines.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE PREFERRED EMBODIMENTS

Figure 1:
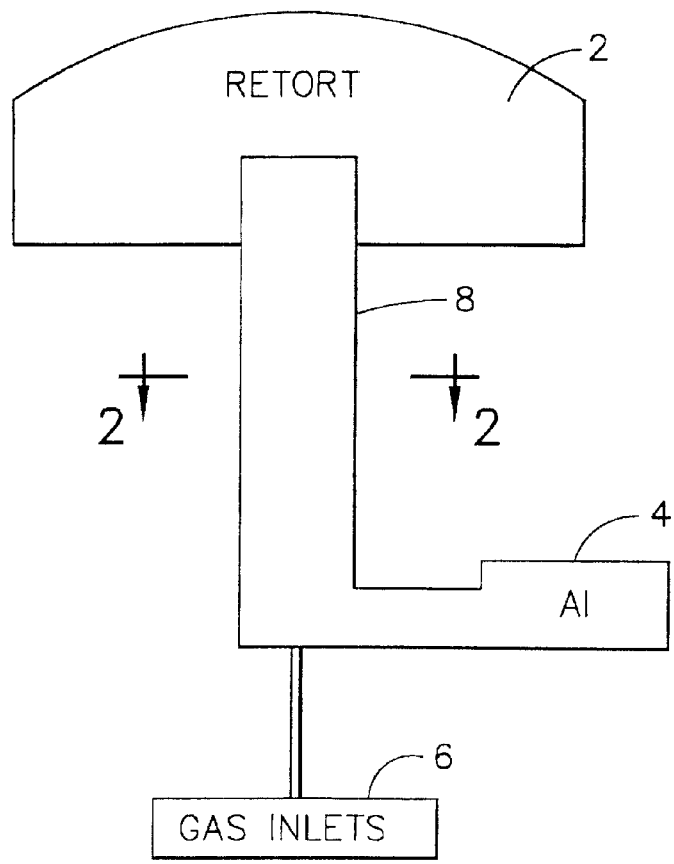
FIG. 1 a schematic of a CVD system of a version of the present invention.

Referring now to the figures, where like parts have the same numbers, in accordance with a preferred embodiment of the invention, there is shown in FIG. 1 a schematic of a CVD system of a version of the present invention.

Articles to be coated (not shown), for example, components requiring environmental coatings and/or thermal barrier coating systems were fixtured in a retort 2 after applying a layer of platinum to the article using known methods, for example, electroplating followed by an optional diffusion heat treatment. When an optional diffusion heat treatment is performed, a mixture of Pt and $PtAl_2$ and NiAl can be produced. This optional diffusion layer can be grown into the substrate as Al and Ni from the substrate diffuse outwardly. These components may be, for example, components located in the hot section of a gas turbine engine, for example, a jet engine, such as, for example, turbine blades and vanes, combustors, shrouds and other such components.

Figure 2:
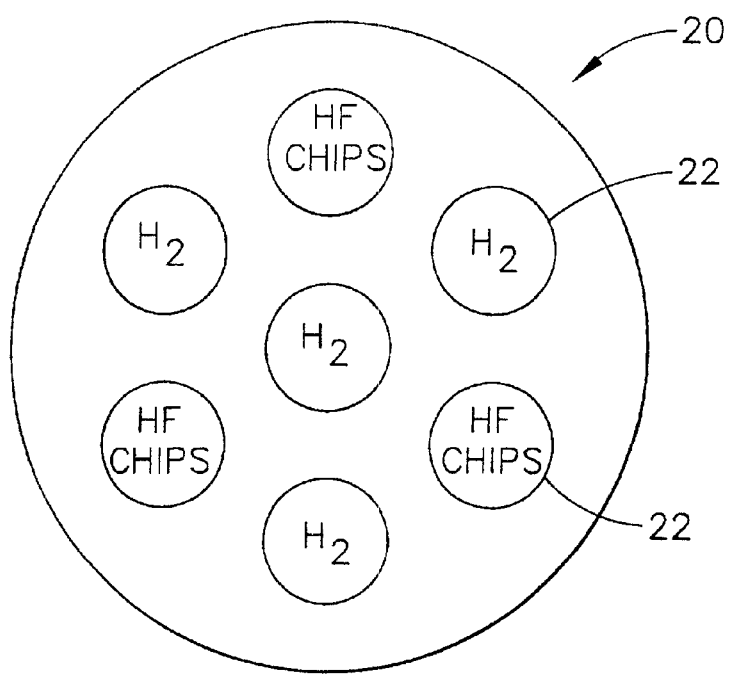
FIG. 2 is a cross-section at A—A of the internal gas generator of FIG. 1.

An external generator 4 receiving a flow of gas from gas inlets 6 was used to produce aluminum trichloride gas using standard CVD processes well known in the art. A source of halide gas is introduced into the external generator that includes a source of aluminum. The generator is maintained at an elevated temperature by a heat source to allow for the formation of $AlCl_3$, The externally generated $AlCl_3$ gas was passed through an internal gas generator 8. The internal generator 8 was in the form of an array 20 of seven tubes 22 configured as shown in FIG. 2 to act as a fluid conduit from the external generator to the retort 2 such that at least a portion of the array was disposed within the retort 2 which can also be heated to an elevated temperature by an independent heat source in order to control the rate of deposition of metal from gases as will be explained. The portion of the tubes 22 disposed within the retort was perforated in a manner and in a location that allowed active gas to be released directly into the retort 2. A preselected number, three in the preferred embodiment, of the outer tubes 22 were filled with hafnium metal chips as shown in FIG. 2. The number of tubes filled and the amount of reactive metal chips in each tube can be varied to produce the desired partial pressure of reactive metal halide, which will affect the concentration of reactive metal deposited on the parts in the retort.

In the preferred embodiment, the $AlCl_3$ gas produced in the external generator 4 was passed over these hafnium chips, producing internally within the retort 2 a hafnium chloride gas. It is believed that the hafnium species was most likely $HfCl_4$ with some lesser hafnium chloride species. At least a portion of the $AlCl_3$ was reduced to either a dichloride or a monochloride. While there was most likely a mixture of several metal chlorides, what is critical was that at least some of the aluminum chloride coming from the external generator 4 activated the hafnium metal, in the preferred embodiment, contained within the tubes and that aluminum chloride and hafnium chloride gases were allowed to mix well before reaching the articles to be coated. An inert carrier gas, for example hydrogen, helium, argon or nitrogen was flowed with $AlCl_3$ through the remaining four tubes of the array. In this manner, the gases were thoroughly mixed and both aluminum and hafnium were co-deposited onto the part without the need for two external generators.

The resulting additive coating consisted of a single phase microstructure that has been shown to significantly increase the furnace cycle test life of the modified platinum aluminide bond coat. A single phase additive layer of platinum aluminide was produced with at least about 0.1 w/o Hf, and about 0.1 to about 15 w/o Hf in the coating immediately below the additive layer in the outermost portion of the diffusion layer. The Hf and Al diffuse inward from the additive layer while some deposited Pt and Ni from the substrate also diffuse through the additive layer to its outer surface. The aluminum content of the coating as well as the platinum content of the coating can be adjusted to be any operable amount by adjusting their amounts in the additive layer. The single phase nature of the additive layer is believed to have occurred because the hafnium and aluminum are in solution. In the diffusion zone immediately below the additive layer, the hafnium is believed to precipitate out of solution, hence the amount of hafnium in this region can vary from the amount in the single phase additive layer, as little as 0.1 w/o Hf, up to 15 w/o Hf.

A thermal barrier coating (TBC) such as yttrium-stabilized zirconia (YSZ) may be deposited over the modified platinum aluminide bond coat of the present invention using techniques well known in the art.

In the preferred embodiment illustrated in FIG. 2, the internal generator is in the form of seven tubes, three of which are occupied by hafnium chips to produce the coating having the composition as set forth above. It will be understood by those skilled in the art that the number of tubes can be increased or decreased as desired. It will be further understood by those skilled in the art that the partial pressure of the reactive metal gases delivered to the retort can be varied by increasing or decreasing the number of tubes containing the reactive metals. The partial pressure may be controlled by increasing or decreasing the amount and size of the reactive metal material in the tubes over which the halide gas must pass. By increasing or decreasing the available surface area of the reactive metal present, the activity of the reaction between the reactive metal and the chloride gas will be increased or decreased and the deposition rate can be controlled.

The composition of the coating is also modified to include more than one reactive metal, if desired. For example, if it is desired that the composition of the coating includes several reactive metals, then these reactive metals can be added to the composition by including chips of these desired metals in one or more of the tubes shown in FIG. 2. For example, if it is desired that a coating include Nb and Ta in addition to Hf, then tubes in the internal generator can include chips of Hf, Ta and Nb, which can be converted to chloride-bearing species of each of these elements as the $AlCl_3$ is passed over the metal chips. The desired partial pressure, and hence the amount of each reactive element in the coating, can be adjusted by controlling the amount of metal chips in the tubes. More tubes have additional amounts of these reactive metals added, or additional metals added to achieve both the desired composition and concentration in the coating.

Of course, following application of the additive layer in each of these examples, an optional heat treatment of from about 1 to about 4 hours at temperatures of from about 1800° F. to about 2000° F. (982–1093° C.) is applied to allow for additional diffusion of elements from the additive layer into the diffusion layer as well as growth of the diffusion layer, and to allow elements such as Pt and Ni to diffuse into the additive layer, if desired, prior to application of a TBC. However, the optional heat treatment is not necessary, since sufficient diffusion occurs while the substrate is within the retort during CVD processing. Because the CVD process is applied at temperatures between 1800°–2200° F. (982–1204° C.) for periods of time of 1–4 hours, there is sufficient time at elevated temperatures for diffusion to occur and for a diffusion layer to form between the additive layer and unaffected substrate.

The following two examples demonstrate that the hafnium-modified platinum aluminide bond coatings produced by the present invention resulted in significant furnace cycle test life improvements and hence, increased bond strength at 2125° F. (1163° C.).

A sample of 20 test coupons were prepared using a composition of Rene N5 superalloy, which nominally is 7.5 wt. % Co; 6.2 wt. % Al; 7 wt. % Cr; 6.5 wt. % Ta; 5 wt. % W; 1.5 wt. % Mo; 3 wt. % Re; 0.15 wt. % Hf; 0.5 wt. % max Y; 0.05 wt. % C; 63.1 wt. % Ni; and 40 ppm B. All samples had a layer of platinum applied utilizing electroplating followed by a heat treatment in the temperature range of about 1800°–2000° F. (982–1093° C.) for about 1 to 4 hours as is well known in the art to produce a thickness of about 0.3 mils.

Three samples received a platinum aluminide bond coat using prior art chemical vapor deposition, to be used as a baseline.

Example 1

Nine test coupons were placed in a retort and heated to a temperature of about 1100° C. (2012° F.). Utilizing the method of the present invention, three of the outer tubes of the internal gas generator of FIG. 2 were completely filled with hafnium chips. $AlCl_3$ gas was delivered to the hafnium filled tubes of the internal gas generator from a prior art external Al gas generator at a temperature of about 450° C. (842° F.) and a flow rate of about 3 liters per minute (lpm). Hydrogen carrier gas was flowed through the center pipe at about 189 lpm, through the inactive internal pipes (those without hafnium chips) at about 19 lpm, and through the active internal pipes (those containing the hafnium chips) at about 47 lpm for a total of about 480 minutes (not including warm-up/purge/shutdown).

Following application of the modified platinum aluminide bond coat according to the present invention, the nine test coupons and three baseline coupons were subjected to furnace cycle testing. Each cycle of the furnace cycle test consisted of heating the coupon to about 2125° F. (1163° C.) over a 10 minute period, maintaining the coupon at a temperature of about 2125° F. (1163° C.) for a period of about 45 minutes, and allowing the coupon to cool to a temperature of about 200° F. (93° C.) over a nine minute period. This cycle was repeated until there was bond failure.

The baseline coupons had an average furnace cycle test (FCT) life of 240 cycles, while the modified platinum aluminide bond coat of the present invention had an average FCT life of 818 cycles, clearly signifying an FCT life improvement (representing increased bond strength).

EXAMPLE 2

Eight test coupons were placed in a retort and heated to a temperature of about 1100° C. (2012° F.). Utilizing the method of the present invention, three of the outer tubes of the internal gas generator of FIG. 2 were filled approximately three quarter full with hafnium chips. $AlCl_3$ gas was delivered to the hafnium filled tubes of the internal gas generator from a prior art external Al gas generator at a temperature of about 450° C. (842° F.) and a flow rate of about 3 liters per minute (lpm). Hydrogen carrier gas was flowed through the center pipe at about 189 lpm, through the inactive internal pipes (those without hafnium chips) at about 19 lpm, and through the active internal pipes (those containing the hafnium chips) at about 47 lpm for a total of about 480 minutes (not including warm-up/purge/shutdown).

Following application of the modified platinum aluminide bond coat according to the present invention, the eight test coupons and were subjected to furnace cycle testing as described in Example 1 and compared to the FCT life of the three baseline coupons described in Example 1.

The modified platinum aluminide bond coat had an average FCT life of 1008 cycles compared to the baseline coupons average FCT life of 240 cycles, clearly signifying further improvement in FCT life (representing further increased bond strength).

A major factor in arriving at the benefits of the present invention is that the aluminum and reactive metals such as hafnium are co-deposited in solution as a single phase in the additive layer utilizing only one external gas generator.

It is believed that the processes of the present invention are also successfully applicable to cobalt based superalloy substrates.

A further advantage of the present invention is that the process provides the capability for modification of existing CVD reactors to produce hafnium-modified coatings or coatings including a plurality of reactive metals without the addition of new external gas generation systems.

Although the present invention has been described in connection with specific examples and embodiments, those skilled in the art will recognize that the present invention is capable of other variations and modifications within its scope. For example, although Hf modifier has been used as an exemplar, it is envisioned other reactive metal modifiers may be utilized individually in place of Hf or in combination with Hf and with themselves, as desired. These examples and embodiments are intended as typical of, rather than in any way limiting on, the scope of the present invention as presented in the appended claims.

What is claimed is:

1. A method of depositing a modified platinum aluminide diffusion coating onto a superalloy substrate, comprising the steps of:
    applying a layer of a Pt-group metal over at least one surface of the superalloy substrate;
    placing the Pt-group metal-coated superalloy substrate into a CVD retort;
    generating an Al-halide gas in an external gas generator;
    generating a modified reactive metal-halide gas by passing a portion of the Al-halide gas generated in the external gas generator into an internal gas generator, a portion of which extends into the retort and that includes at least one reactive metal to produce a modified reactive metal-halide gas;
    mixing the Al-halide gas and the modified reactive metal-halide gas together;
    passing the mixture of Al-halide gas and the reactive metal-halide gas over the Pt-group-plated, superalloy substrate in the retort for a preselected period of time at a preselected temperature; and
    co-depositing Al and the reactive metal onto the Pt-group plated superalloy substrate to form a reactive metal-modified platinum group aluminide coating over the substrate.

2. The method of claim 1 wherein the step of generating a modified reactive metal-halide gas includes contacting a portion of the Al-halide gas with a gas generator that includes at least one reactive metal selected from the group consisting of Hf, Zr, V, Nb, Ta, Y, La and Ce.

3. The method of claim 1 wherein the step of generating a modified metal-halide gas is accomplished by passing the Al-halide gas through an internal gas generator.

4. The method of claim 1 wherein the internal gas generator is comprised of a plurality of tubes having at least one of which includes at least one reactive metal.

5. The method of claim 4 wherein the internal gas generator is comprised of seven tubes for transporting Al-halide gas from the external gas generator to the retort, at least one of the tubes including a source of at least one reactive metal for generating the modified reactive metal-halide gas.

6. The method of claim 1 further including the step of applying a ceramic thermal barrier coating over the reactive metal-modified Pt-group aluminide coating.

7. The method of claim 2 wherein the step of generating a modified reactive metal-halide gas includes passing a portion of the Al-halide gas into a gas generator that includes the reactive metal Hf.

8. The method of claim 7 wherein the step of co-depositing Al and the reactive metal includes co-depositing Hf and Al onto a Pt-plated superalloy substrate to form a Hf-modified platinum aluminide coating having a single phase additive layer of platinum aluminum having at least about 0.1 w/o Hf and a diffusion layer formed between the substrate and the additive layer, the diffusion layer having a variable amount of Hf from about 0.1 w/o to about 15 w/o, the balance of the diffusion layer comprising Al, Pt and Ni.

9. The method of claim 1 wherein the step of passing the mixture of Al-halide gas and the reactive metal-halide gas over the Pt-group-plated, superalloy substrate in the retort at a preselected temperature is performed for about one to four hours.

10. The method of claim 1 wherein the step of passing the mixture of Al-halide gas and the reactive metal-halide gas over the platinum group-plated, superalloy substrate in the retort for a preselected period of time is performed at a temperature in the range of from about 1800°–2200° F.

11. The method of claim 1 further including heat treating the Pt-group-metal coated superalloy substrate for period of about 1–4 hours at a temperature in the range of about 1800°–2000° F. to develop a diffusion zone between the deposited Pt-group metal and the substrate prior to placing the substrate into the retort.

12. The method of claim 2 wherein the step of generating a modified reactive metal-halide gas by passing a portion of the Al-halide gas generated in the external gas generator into the gas generator positioned in the retort between the substrate and the external gas generator.

13. A method of depositing a modified platinum aluminide diffusion coating onto at least one surface of a nickel-based superalloy substrate, comprising the steps of:

electrodepositing a layer of Pt onto the superalloy substrate;

placing the Pt-coated superalloy substrate into a CVD retort;

forming an $AlCl_3$ gas by introducing a chlorine gas into an external gas generator and passing the gas over a source of Al at a temperature sufficient to form $AlCl_3$;

passing a portion of the $AlCl_3$ over a source of Hf at a temperature sufficient to reduce $AlCl_3$ and generate a gas including a portion of $HfCl_4$;

mixing the $AlCl_3$ gas and the $HfCl_4$ together;

passing the mixture of $AlCl_3$ and the $HfCl_4$ gas together over the Pt-plated, superalloy substrate in the retort for a preselected period of time at a preselected temperature; and co-depositing Al and Hf onto the Pt-plated superalloy substrate to form a Hf-modified platinum aluminide coating over the substrate.

14. The method of claim 13 wherein the step of co-depositing Al and Hf includes co-depositing onto the Pt-plated superalloy substrate to form a Hf-modified platinum aluminide coating having a single phase additive layer of platinum aluminum with at least about 0.1 w/o Hf in solution.

15. The method of claim 14 further including a diffusion layer formed between the substrate and the additive layer, the diffusion layer having a variable amount of Hf from about 0.1 w/o to about 15 w/o, the balance of the diffusion layer comprising Al, Pt and Ni.

16. The method of claim 13 wherein the step of passing the mixture of Al-halide gas and Hf-halide gas over the platinum group-plated, superalloy substrate in the retort for a preselected period of time is performed at a temperature in the range of from about 1800°–2200° F. for about one to four hours.

* * * * *